United States Patent
Sakagami et al.

(10) Patent No.: US 12,148,545 B2
(45) Date of Patent: Nov. 19, 2024

(54) CONDUCTIVE WIRE FOR ELECTRICAL PROPERTIES TESTING AND METHOD FOR PRODUCING THE SAME

(71) Applicant: SWCC Corporation, Kawasaki (JP)

(72) Inventors: Yoshihiro Sakagami, Kawasaki (JP); Go Odachi, Kawasaki (JP); Rikuya Watanabe, Kawasaki (JP); Tsutomu Koizumi, Kawasaki (JP); Ryuichi Arai, Kawasaki (JP)

(73) Assignee: SWCC Corporation, Kawasaki (JP)

( * ) Notice: Subject to any disclaimer, the term of this patent is extended or adjusted under 35 U.S.C. 154(b) by 0 days.

(21) Appl. No.: 18/699,752

(22) PCT Filed: Mar. 22, 2023

(86) PCT No.: PCT/JP2023/011321
§ 371 (c)(1),
(2) Date: Apr. 9, 2024

(87) PCT Pub. No.: WO2023/238476
PCT Pub. Date: Dec. 14, 2023

(65) Prior Publication Data
US 2024/0331891 A1 Oct. 3, 2024

(30) Foreign Application Priority Data
Jun. 8, 2022 (JP) .................... 2022-093060

(51) Int. Cl.
*H01B 1/02* (2006.01)
*H01B 5/02* (2006.01)
(Continued)

(52) U.S. Cl.
CPC ............... *H01B 1/026* (2013.01); *H01B 5/02* (2013.01); *H01B 13/0003* (2013.01); *H01B 13/0036* (2013.01); *G01R 1/067* (2013.01)

(58) Field of Classification Search
CPC . H01B 1/02; H01B 1/026; H01B 5/02; H01B 7/02; H01B 7/04; H01B 7/06;
(Continued)

(56) References Cited

U.S. PATENT DOCUMENTS 5,106,701 A * 4/1992 Kurosaka ............... H01B 1/026
148/684
6,063,217 A * 5/2000 Saleh ..................... H01B 1/026
148/685
(Continued)

FOREIGN PATENT DOCUMENTS

JP 2004055179 A 2/2004
JP 2005336510 A 12/2005
(Continued)

OTHER PUBLICATIONS

PCT International Search Report for International Application No. PCT/JP2023/011321, mailed Jun. 20, 2023, 6pp.
(Continued)

*Primary Examiner* — William H. Mayo, III
(74) *Attorney, Agent, or Firm* — The Roy Gross Law Firm, LLC; Roy Gross

(57) ABSTRACT

A conductive wire for electrical properties testing having high hardness and conductivity, which is composed of a copper alloy, and includes in its outer periphery portion a fibrous structure extending at an angle of 0.5 to 20 degrees with respect to the length direction of the conductive wire.

6 Claims, 3 Drawing Sheets

(51) Int. Cl.
*H01B 13/00* (2006.01)
*G01R 1/067* (2006.01)

(58) Field of Classification Search
CPC ... H01B 9/02; H01B 9/04; H01B 9/06; H01B 11/06; H01B 13/003; H01B 13/130036; G01R 1/067; C22F 1/08; C22F 1/902
USPC ......... 174/102 R–120 R; 428/553, 554, 606; 148/432, 165 C
See application file for complete search history.

(56) References Cited

U.S. PATENT DOCUMENTS

| | | | | |
|---|---|---|---|---|
| 7,544,886 | B2* | 6/2009 | Detian | ............... H01B 11/20 174/113 R |
| 2002/0066503 | A1* | 6/2002 | Matsui | ............... C22F 1/08 148/432 |
| 2003/0037957 | A1* | 2/2003 | Ueno | ............... D07B 1/147 174/128.1 |
| 2004/0187977 | A1* | 9/2004 | Matsui | ............... H01B 1/026 428/606 |
| 2004/0231883 | A1* | 11/2004 | Kondo | ............... H01B 3/443 174/128.1 |
| 2005/0260438 | A1* | 11/2005 | Aoyagi | ............... C22C 9/00 428/673 |
| 2018/0322979 | A1* | 11/2018 | Sekiya | ............... H01B 13/0016 |
| 2018/0371580 | A1* | 12/2018 | Sekiya | ............... C22F 1/08 |
| 2021/0332467 | A1 | 10/2021 | Liu et al. | |

FOREIGN PATENT DOCUMENTS

| | | |
|---|---|---|
| JP | 2009280860 A | 12/2009 |
| JP | 2010205549 A | 9/2010 |
| JP | 2011146352 A | 7/2011 |
| JP | 2022028598 A | 2/2022 |
| KR | 20140001836 A | 1/2014 |
| WO | 2007/046378 A1 | 4/2007 |
| WO | 2016/159316 A1 | 10/2016 |

OTHER PUBLICATIONS

PCT Written Opinion for International Application No. PCT/JP2023/011321, mailed Jun. 20, 2023, 3pp.

L.Zhang, L.Meng "Microstructure, mechanical properties and electrical conductivity of Cu-12 wt.% Ag wires annealed at different temperature", Materials Letters, vol. 58, 2004, pp. 3888-3892, https://doi.org/10.1016/j.metlet.2004.08.014.

United States Patent and Trademark Office, Non-Final Office Action: Restriction Requirement for related U.S. Appl. No. 18/700,425, mailed Sep. 4, 2024, 9pp.

United States Patent and Trademark Office, Non-Final Office Action for related U.S. Appl. No. 18/700,425, mailed Sep. 26, 2024, 16pp.

* cited by examiner

CONDUCTIVE WIRE FOR ELECTRICAL PROPERTIES TESTING AND METHOD FOR PRODUCING THE SAME

TECHNICAL FIELD

The present invention relates to a conductive wire for electrical properties testing and a method for producing the same.

BACKGROUND ART

In recent years, with the miniaturization of electronic devices, there has been a demand such as high-density mounting on various circuit boards to be used in these devices. For various circuit boards such as these various mounting boards and IC package boards, it is common to perform various electrical properties testing such as direct current resistance measurement and continuity testing during the production thereof. In general, testing of such electrical properties often uses a contact probe configured to contact the electrode of a circuit board, and a testing device (signal processing device) for measuring resistance values and the like via the contact probe (for example, Patent Literature (hereinafter, referred to as PTL) 1). Conductive wires used in such testing devices and contact probes are also required to have smaller diameters and higher electrical conductivity (herein also simply referred to as "conductivity") to meet the needs for high-density mounting on various circuit boards, and the like. In addition, conductive wires used in testing devices and contact probes are required to have high hardness in some cases.

Copper alloy wires are commonly used as conductive wires for the above testing devices, probes, and the like. A copper alloy generally becomes harder as strain is applied thereto. Therefore, wire drawing or rolling is conventionally used for increasing the hardness of a copper alloy wire.

CITATION LIST

Patent Literature

PTL 1
WO2016/159316

SUMMARY OF INVENTION

Technical Problem

For increasing the hardness by such wire drawing or rolling as described above, it is necessary to increase the casting diameter and repeat the wire drawing or rolling a large number of times. However, it is difficult to perform wire drawing on a wire rod with a large casting diameter, resulting reduction of productivity and/or increase in production costs. Furthermore, the conductivity of a commonly used copper alloy tends to decrease due to wire drawing or rolling, therefore, obtainment of a conductive wire that has both high hardness and high conductivity is difficult.

The main object of the present invention is to provide a conductive wire for electrical properties testing and having high hardness and high conductivity, and a method for producing such a conductive wire.

Solution to Problem

In order to achieve the above object, one aspect of the present invention provides the following.

A conductive wire for electrical properties testing, the conductive wire including:
 a copper alloy containing 0.1 to 30 mass % of silver, with a remainder being copper and unavoidable impurities, in which
 an outer periphery portion of the conductive wire includes a fibrous structure extending in a direction at an angle of 0.5° to 20.0° with respect to a length direction of the conductive wire, and
 the conductive wire has a Vickers hardness of 300 HV or more and a conductivity of 57% IACS or more.

Another aspect of the invention provides the following.
A method for producing a conductive wire for electrical properties testing, the method including:
 preparing a copper alloy wire containing 0.1 to 30 mass % of silver, with a remainder being copper and unavoidable impurities; and
 twisting the copper alloy wire by, while the copper alloy wire is conveyed in a conveyance direction and is pushed in a predetermined direction, rotating the copper alloy wire in a circumferential direction of the copper alloy wire, in which
 in the twisting the copper alloy wire, an angle between the copper alloy wire having been pushed and the conveyance direction of the copper alloy wire is set to 10 to 70°, and a speed of the rotating in the circumferential direction relative to a conveyance speed of the copper alloy wire is set to 1 to 60 rotations/mm.

Advantageous Effects of Invention

The present invention is capable of providing a conductive wire for electrical properties testing and having high hardness and high conductivity, and a method for producing such a conductive wire.

DESCRIPTION OF EMBODIMENTS

Figure 1:
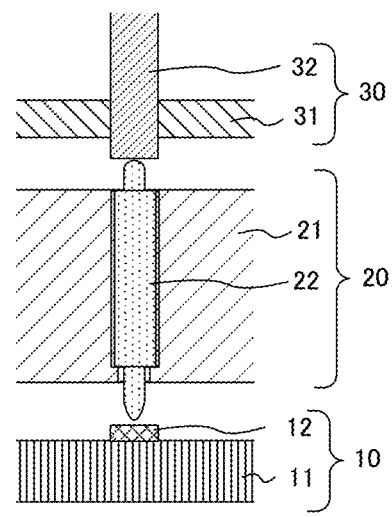
FIG. 1 is a schematic diagram for describing a contact probe and a testing device in which a conductive wire for electrical properties testing can be used.

Hereinafter, a conductive wire for electrical properties testing (hereinafter also simply referred to as a "conductive wire") according to an embodiment of the present invention and a method for producing such a conductive wire will be described.

However, the conductive wire and the method for producing the same of the present invention are not limited to the embodiment described below. Herein, "to" indicating a numerical range includes the upper and lower limits of the numerical range.

Conductive Wire for Electrical Properties Testing

A conductive wire of the present embodiment is composed of a copper alloy.

The copper alloy preferably contains one or more of silver, tin, beryllium, zinc, nickel, magnesium, aluminum, titanium, zirconium, indium, silicon, and phosphorus, with the remainder being copper and unavoidable impurities. The copper alloy wire is preferably a copper alloy containing copper and silver.

The amount of silver is appropriately selected depending on the desired properties of the conductive wire, but is preferably 0.1 to 30 mass %, more preferably 10 to 15 mass %. When the amount of silver is within the above range, the hardness and conductivity of the conductive wire can be easily controlled to fall within a desired range.

The diameter of the conductive wire is appropriately selected according to the application of the conductive wire, but is usually preferably 0.2 mm or less, and more preferably 0.01 mm to 0.1 mm. When the diameter of a conductive wire is within the above range, the conductive wires can be disposed at narrow pitches when used, for example, for an electrical properties testing device or probe pins.

The conductive wire of the present embodiment includes, in the outer periphery portion thereof, a fibrous structure extending in a predetermined direction.

The term "outer periphery portion of a conductive wire" refers to a region in the vicinity of the circumferential surface of the conductive wire, for example, a region ranging from the outer circumferential surface of the conductive wire to a depth of 1/3 of the diameter of the conductive wire. The angle between the length direction of the conductive wire and the extending direction of the fibrous structure is 0.5° or more and 20° or less, preferably 0.5° or more and 11.2° or less, and more preferably 3.3° or more and 11.2° or less. The fibrous structure extending in the above direction indicates that a predetermined force was applied in a predetermined direction during the production of the conductive wire.

Specifically, during the production of a conductive wire, performing a twisting step described below generates a fibrous structure extending in a predetermined direction around the conductive wire. When the angle between the length direction of the conductive wire and the extending direction of the fibrous structure is 0.5° or more, the hardness of the conductive wire is significantly increased, and also the conductivity is more likely to be improved. When the angle exceeds 20°, the wire may break, and when the angle is 20° or less, hardness and conductivity are more likely to be improved. Determining whether the outer periphery portion of a conductive wire has the above-described fibrous structure, or specifying the angle between the length direction of the conductive wire and the extending direction of the fibrous structure can be performed as follows: polishing the conductive wire by approximately 20% of the diameter thereof from the surface of the conductive wire, and observing the polished surface with a video microscope or scanning electron microscope.

The conductivity of the conductive wire is preferably 50% IACS or more, more preferably 57% IACS or more.

When the conductivity of a conductive wire is 60% IACS or more, the conductive wire can be easily used for various applications as described below. Although the upper limit of the conductivity of the conductive wire is not limited, the upper limit of the conductive wire is usually about 85% IACS.

The Vickers hardness of the conductive wire is appropriately selected according to the application of the conductive wire.

For example, when a conductive wire is used for a below-described probe for electrical properties testing, the Vickers hardness of the conductive wire is preferably 300 HV or more, more preferably 320 HV or more. On the other hand, when a conductive wire is used as a lead wire or the like of a below-described device for electrical properties testing, the Vickers hardness of the conductive wire is preferably 250 HV or more. When the Vickers hardness is within the above range, the conductive wire can be easily used for various applications. Vickers hardness herein is a value measured in accordance with JIS Z2244.

The elongation of the conductive wire is preferably 1 to 5%.

The elongation rate can be determined by using a precision universal testing machine or the like (for example, manufactured by Shimadzu Corporation). When the elongation of a conductive wire is 5% or less, sagging is less likely to occur at the end of the conductive wire, for example, even when the end repeatedly comes into contact with other members.

It is preferable that the conductive wire has high straightness.

The radius of curvature of the conductive wire is preferably 300 mm or more, more preferably 1000 mm or more. When a conductive wire has high straightness, it is possible to prevent the conductive wire from coming into contact with an adjacent conductive wire or becoming entangled with an adjacent conductive wire when the conductive wire is used in a device for electrical properties testing or the like. When a conductive wire high straightness, the conductive wire can be easily used for various applications. The radius of curvature is a value calculated from three points randomly selected from the arc of a sample by using a digital microscope VHX-6000 manufactured by Keyence Corporation.

The conductive wire is mainly used in devices, instruments, and the like for testing electrical properties.

Examples of applications of the conductive wire include, but are not limited to, lead wires in devices for electrical properties testing, and probe pins in contact probes.

FIG. 1 illustrates contact probe 20 for testing the electrical properties of circuit board 10 that includes substrate 11 and electrodes 12, and a part of testing device 30 to be connected to contact probe 20.

Contact probe 20 illustrated in FIG. 1 includes probe pin 22 and support part 21 supporting probe pin 22. Testing device 30 includes lead wire 32, holding part 31 supporting lead wire 32, and a signal processing unit (not illustrated) connected to lead wire 32. In contact probe 20 and testing device 30 having such a configuration, pressing probe pin 22 against lead wire 32 and electrode 12 of circuit board 10 allows transmission of an electrical signal from the circuit board 10 side to testing device 30. By detecting the electrical signal with the signal processing unit, for example, the direct current resistance value of circuit board 10 can be measured, and continuity testing can be performed.

The above-described conductive wire can be used for probe pin 22 of contact probe 20 and also for lead wire 32 of testing device 30. Probe pin 22 and lead wire 32 are repeatedly subjected to contact. Therefore, when the hardness of a conductive wire used for the probe pin or the lead wire is low, the wire may wear out due to repeated contact.

The above-described conductive wire on the other hand has both high hardness and high conductivity. Therefore, the conductive wire of the present invention is particularly advantageous for these applications.

When the above-described conductive wire is used as lead wire 32, an insulating coating may be formed around the conductive wire. Forming an insulating coating around the conductive wire can prevent contact between adjacent lead wires 32. The insulating coating may be any coating made of a resin in the same manner as an insulating coating of a commonly used conductive wire. Examples of resins that can be used for the insulation coating include, but are not limited to, polyurethane resins, nylon resins, polyester resins, epoxy resins, polyesterimide resins, polyamide resins, and polyamideimide resins. The thickness of the insulation coating is also appropriately selected according to the application, and may be, for example, about 1.0 to 10 μm.

Method for Producing Conductive Wire for Electrical Properties Testing

The above-described conductive wire can be produced, for example, by the following method. However, the method for producing the conductive wire is not limited to the following method. The producing method of the present embodiment includes the following steps: preparing a copper alloy wire containing copper and silver (hereinafter also simply referred to as "preparing step"); pushing the copper alloy wire in a predetermined direction and rotating the copper alloy wire in the circumferential direction of the copper alloy wire while conveying the copper alloy wire in a conveyance direction (hereinafter also simply referred to as "twisting step"); and untwisting the copper alloy wire having subjected to the twisting (hereinafter also simply referred to as the "untwisting step").

In the preparing step, a copper alloy wire containing copper and silver is prepared. The composition of the copper alloy wire is the same as that of the copper alloy contained in the above-described conductive wire. The copper alloy wire may be produced by any method, for example, by performing wire drawing on a wire rod produced to have an arbitrary casting diameter. The diameter of the prepared copper alloy wire is preferably 0.2 mm or less, more preferably 0.01 mm to 0.1 mm.

Figure 2:
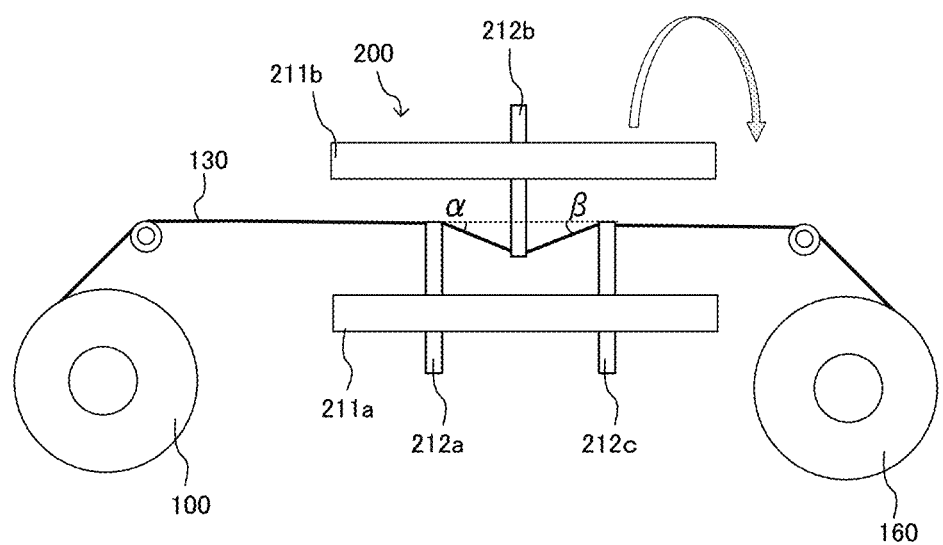
FIG. 2 is a schematic diagram for describing steps of a twisting process (herein also simply referred to as "twisting") in a method of producing a conductive wire for electrical properties testing.

FIG. 2 illustrates a schematic diagram of the twisting step of the present embodiment.

In the twisting step, copper alloy wire 130 prepared in the preparing step is subjected to twisting as described above in processing device 200.

Processing device 200 includes a pair of rotary plates (first rotary plate 211a and second rotary plate 211b) disposed so as to face each other with copper alloy wire 130 therebetween. The pair of rotary plates (first rotary plate 211a and second rotary plate 211b) are configured as follows: the rotary plates are connected to a motor (not illustrated) and rotated together in the circumferential direction of copper alloy wire 130 at a predetermined speed with copper alloy wire 130 as the central axis.

One rotary plate (first rotary plate 211a in the present embodiment) includes first support part 212a and third support part 212c each for supporting copper alloy wire 130 at a predetermined height. The other rotary plate (second rotary plate 211b in the present embodiment) includes second support part 212b for pushing copper alloy wire 130 into a predetermined position. The end of each of support parts 212a, 212b, and 212c includes a groove (not illustrated) for supporting copper alloy wire 130.

In the twisting step, first, copper alloy wire 130 is supported by first support part 212a, second support part 212b, and third support part 212c of processing device 200. At this time, the heights and positions of first support part 212a, second support part 212b, and third support part 212c are adjusted in such a way that the angles (α and β in FIG. 2) each between copper alloy wire 130 pushed down by second support part 212b and the conveyance direction become 10 to 70°. The angles α and β (each between copper alloy wire 130 and the conveyance direction) are preferably 20 to 50°, more preferably 20 to 40°. The angles α and β may be different values, but are preferably the same value.

Subsequently, while copper alloy wire 130 is conveyed from the bobbin 100 (one of the bobbins) side to the bobbin 160 (another one of the bobbins) side at a constant speed, the rotary plates (first rotary plate 211a and second rotary plate 211b) of processing device 200 are rotated in the circumferential direction of copper alloy wire 130 at a constant speed. At this time, the rotational speed of each rotary plate relative to the conveyance speed, that is, the amount of twisting defined by the following equation, is 1 to 60 rotations/mm, preferably 1 to 30 rotations/mm, more preferably 1 to 20 rotations/mm, and even more preferably 1 to 15 rotations/mm.

Amount of twisting=rotational speed [rpm]/conveyance speed of copper alloy wire 130 [mm/min]

By setting the amount of twisting within the above range, an appropriate force is applied to copper alloy wire 130, and a fibrous structure is observed in the outer periphery portion of copper alloy wire 130.

Figure 3:
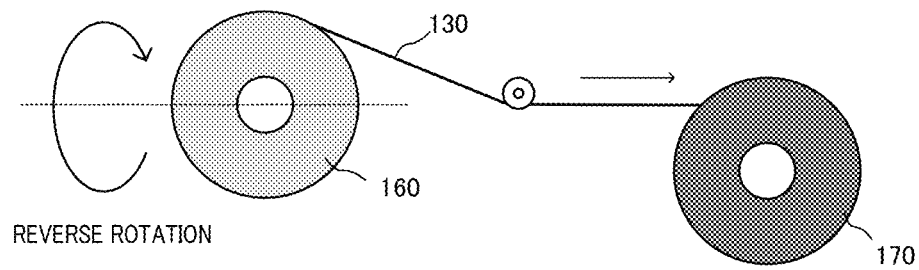
FIG. 3 is a schematic diagram for describing an untwisting step in the method of producing the conductive wire for electrical properties testing.

FIG. 3 illustrates a schematic diagram of the untwisting step of the present embodiment.

In the untwisting step, copper alloy wire 130 having been subjected to the twisting step is untwisted.

In the untwisting step, while the original bobbin 160 (supply bobbin), on which copper alloy wire 130 having been subjected to the twisting step is wound, is rotated, copper alloy wire 130 is wound up on collection bobbin 170 to untwist copper alloy wire 130 (wire rod). It is necessary to rotate supply bobbin 160 in a direction (reverse rotation) opposite to the rotation direction of the rotary plates (first rotary plate 211a and second rotary plate 211b) of processing device 200. The amount of untwisting of copper alloy wire 130 is defined by the following equation.

Amount of untwisting=rotational speed of supply bobbin [rpm]/conveyance speed of copper alloy wire 130 [mm/min]

Specifically, in the untwisting step, the amount of untwisting is adjusted to be smaller than the amount of twisting, and is set to about 0.02 to 3.0% of the amount of twisting. The untwisting step of copper alloy wire 130 mainly contributes to improving the handleability of the copper alloy wire.

Both the twisting step and the untwisting step are usually performed at room temperature.

EXAMPLES

Hereinafter, the present invention will be described in more detail with reference to Examples. However, the scope of the present invention is not limited in any way by the Examples, and the embodiments can be modified without departing from the spirit of the present invention.

(1) Preparation of Sample

A plurality of copper alloy wires each containing 10 mass % of silver with the remainder being copper and unavoidable impurities, and having a diameter of 0.074 mm were prepared (preparing step). Subsequently, by using the processing device illustrated in FIG. 2, while the copper alloy wire is moved at a constant speed, the copper alloy wire was pushed perpendicularly by 4.0 mm in the length direction and at the same time rotated at a speed of 6,000 rpm in the circumferential direction of the copper alloy wire (twisting step). That is, the angles α and β each between copper alloy wire 130 pushed by second support part 212b and the conveyance direction of the copper alloy wire adjusted to be 30°, and the amount of twisting is adjusted to 1 to 15 rotations/mm.

Thereafter, the copper alloy wire was wound up after being untwisted or without being untwisted (see Table 1). The amount of untwisting was adjusted to be about 0.7% (0.01 to 0.11 rotations/mm) of the amount of twisting.

(2) Evaluation of Sample
(2.1) Angle of Fibrous Structure

Each sample of conductive wire for electrical properties testing was polished by 15 μm from the surface thereof. The polished surface was observed with a video microscope, and the angle between the length direction of the conductive wire for electrical properties testing and the extending direction of the fibrous structure was confirmed. Table 1 and FIG. 3 show the results.

(2.2) Measurement of Vickers Hardness and Conductivity

Figure 4:
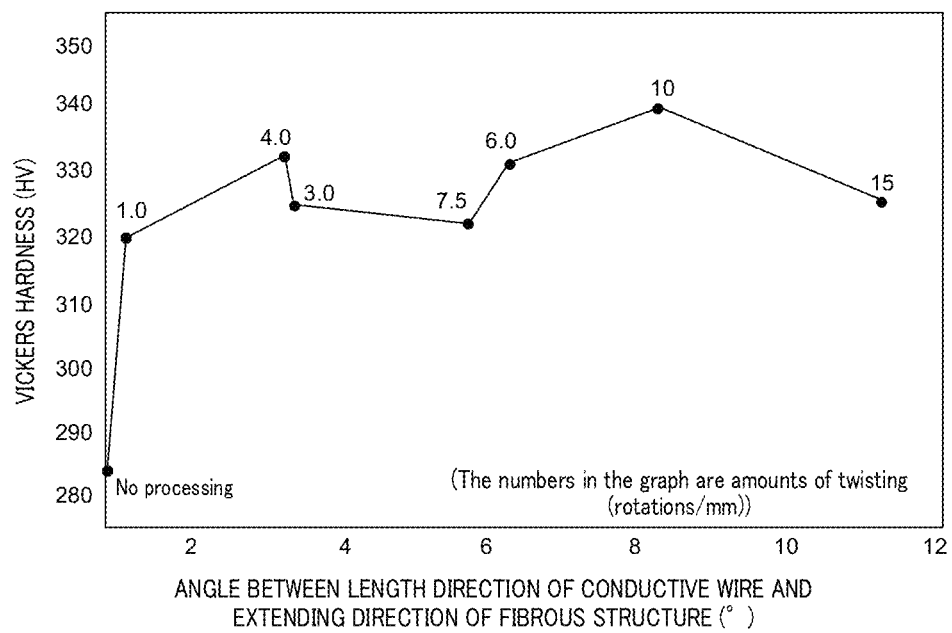
FIG. 4 is a graph illustrating the relationship for the amount of twisting between a Vickers hardness and an angle defined as an angle between the length direction of the conductive wire for electrical properties testing and the extending direction of the fibrous structure.

The hardness (Vickers hardness) of each sample of the conductive wire for electrical properties testing was measured with a Vickers hardness meter in accordance with JIS Z 2244, and the conductivity was measured with a multimeter. Table 1 and FIG. 4 show the results.

(2.3) Evaluation of Handleability

The handleability of each conductive wire for electrical properties testing was evaluated.

Figure 5:
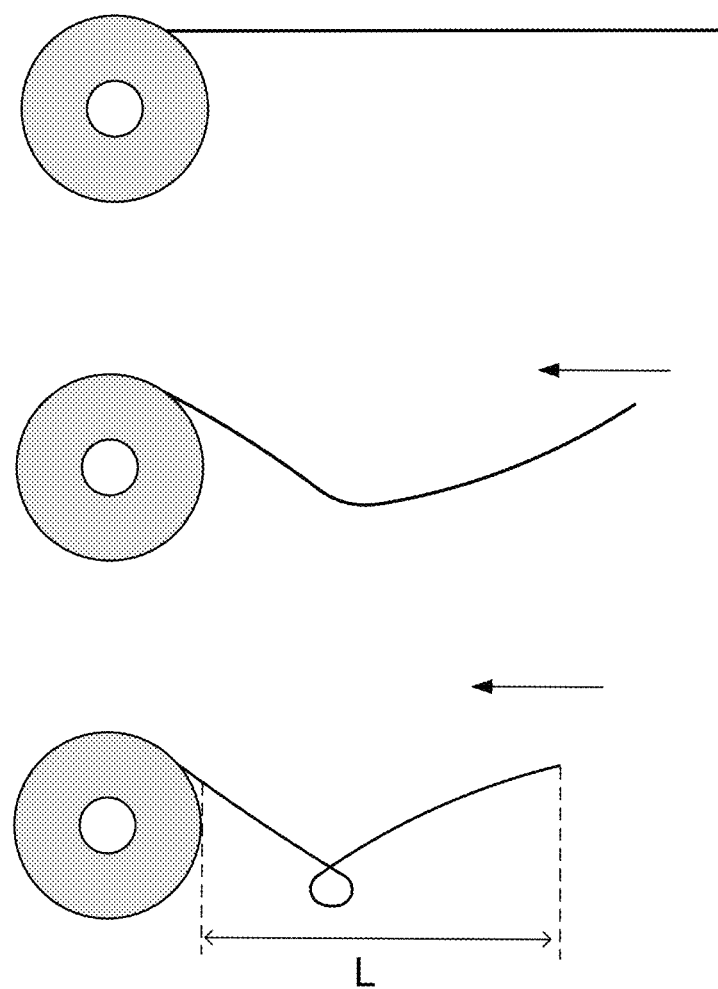
FIG. 5 is a schematic diagram for describing an untwisting step in the method of producing the conductive wire for electrical properties testing.

Specifically, as illustrated FIG. 5, 100 cm of a sample is pulled out from the bobbin on which the sample is wound, the end of the conductive wire is then brought close to the bobbin. The length L when a kink occurs is measured, and the handleability was evaluated based on the length L. Table 1 shows the results. In the Examples, only samples 12, 22, and 42 were subjected to untwisting.

TABLE 1

| Sample | Amount of twisting (rotations/mm) | Angle of fibrous structure* (°) | Hardness (HV) | Conductivity (IACS) | Amount of untwisting (rotations/mm) | Handleability |
|---|---|---|---|---|---|---|
| 1 | No processing | 0 | 283 | 71.7 | — | — |
| 11 | 1.0 | 0.5 | 320 | 73.9 | — | 80 cm |
| 12 | 1.0 | 0.5 | 320 | 73.9 | 0.01 | 20-30 cm |
| 21 | 15 | 11.2 | 326 | 74.2 | — | 90 cm |
| 22 | 15 | 11.2 | 326 | 74.2 | 0.11 | 20-30 cm |
| 31 | 10 | 8.3 | 340 | 73.4 | — | — |
| 41 | 7.5 | 5.7 | 323 | 74.0 | — | 85 cm |
| 42 | 7.5 | 5.7 | 323 | 74.0 | 0.05 | 20-30 cm |
| 51 | 6.0 | 6.3 | 331 | 74.3 | — | — |
| 61 | 4.0 | 3.3 | 332 | 73.8 | — | — |
| 71 | 3.0 | 3.4 | 324 | 73.6 | — | — |

*Angle between length direction of conductive wire for electrical properties testing and extending direction of fibrous structure (3) Summary As shown in Table 1 and FIG. 3 above, the comparison between sample 1 and other samples shows that when the twisting step was performed at an amount of twisting of 1 to 60 rotations/mm while the copper alloy wire was pushed by a predetermined amount, the angle of the fibrous structure fell within a range of 0.5° to 20.0°, and the hardness of the conductive wire was increased. At this time, the electrical conductivity was also increased by the twisting step.

Performing the above twisting step increased the hardness. This is because the twisting step imparts a predetermined angle relative to the length direction in the fibrous structure, increasing deformation resistance. At the same time, the electrical conductivity was also increased. The reason therefor was inferred as follows: the strain in the length direction of the copper alloy wire was released and electron scattering was reduced, or solute elements contained in the matrix were precipitated by the twisting step.

Furthermore, the comparison between samples 11, 21, and 41 and samples 12, 22, and 42 shows that performing the above-described untwisting can reduce the occurrence of a kink in a copper alloy wire that is pulled out from the bobbin.

This application is a National Phase of PCT Patent Application No. PCT/JP2023/011321 having International filing date of Mar. 23, 2022, which claims priority based on Japanese Patent Application No. 2022-093060, filed on Jun. 8, 2022, the entire contents of which including the specification and the drawings are incorporated herein by reference.

INDUSTRIAL APPLICABILITY

The conductive wire for electrical properties testing of the present invention has both high hardness and high conductivity. Therefore, the conductive wire for electrical properties testing can be used for various applications such as contact probes and lead wires for electrical properties testing devices.

REFERENCE SIGNS LIST

10 Circuit board
11 Substrate
12 Electrode
20 Contact probe
21 Support part
22 Probe pin
30 Testing device
31 Holding part
32 Lead wire
100 Bobbin
130 Copper alloy wire
160 Bobbin
170 Bobbin
200 Processing device
211a First rotary plate
211b Second rotary plate
212a First support part
212b Second support part
212c Third support part

The invention claimed is:

1. A conductive wire for electrical properties testing, the conductive wire comprising:
a copper alloy containing 0.1 to 30 mass % of silver, with a remainder being copper and unavoidable impurities, wherein
an outer periphery portion of the conductive wire includes a fibrous structure extending in a direction at an angle of 0.5° to 20.0° with respect to a length direction of the conductive wire, and
the conductive wire has a Vickers hardness of 300 HV or more and a conductivity of 57% IACS or more.

2. The conductive wire according to claim 1, wherein:
the direction in which the fibrous structure extends is at an angle of 0.5 to 11.2°; and
the Vickers hardness is 320 HV or more and the conductivity is 73.4% IACS or more.

3. A method for producing a conductive wire for electrical properties testing, the method comprising:

preparing a copper alloy wire containing 0.1 to 30 mass % of silver, with a remainder being copper and unavoidable impurities; and twisting the copper alloy wire by, while the copper alloy wire is conveyed in a conveyance direction and is pushed in a predetermined direction, rotating the copper alloy wire in a circumferential direction of the copper alloy wire, wherein in the twisting the copper alloy wire, an angle between the copper alloy wire having been pushed and the conveyance direction of the copper alloy wire is set to 10 to 70°, and a speed of the rotating in the circumferential direction relative to a conveyance speed of the copper alloy wire is set to 1 to 60 rotations/mm.

4. The method according to claim 3, wherein:

in the twisting the copper alloy wire, the angle between the copper alloy wire having been pushed and the conveyance direction of the copper alloy wire is set to 20 to 40°, and the speed of the rotating in the circumferential direction relative to the conveyance speed of the copper alloy wire is set to 1 to 15 rotations/mm.

5. The method according to claim 3, further comprising:

untwisting the copper alloy wire having been subjected to the twisting by, while the copper alloy wire is conveyed in a conveyance direction, rotating the copper alloy wire in a direction opposite to a direction of the rotating during the twisting.

6. The method according to claim 5, wherein in the untwisting the copper alloy wire, an amount of the untwisting is set at 0.02 to 3.0% of an amount of the twisting.

* * * * *